United States Patent
Xie et al.

(10) Patent No.: US 10,211,100 B2
(45) Date of Patent: Feb. 19, 2019

(54) METHODS OF FORMING AN AIR GAP ADJACENT A GATE OF A TRANSISTOR AND A GATE CONTACT ABOVE THE ACTIVE REGION OF THE TRANSISTOR

(71) Applicant: GLOBALFOUNDRIES Inc., Grand Cayman (KY)

(72) Inventors: Ruilong Xie, Niskayuna, NY (US); Lars Liebmann, Halfmoon, NY (US); Nigel Cave, Saratoga Springs, NM (US); Andre Labonte, Mechanicville, NY (US); Nicholas LiCausi, Watervliet, NY (US); Guillaume Bouche, Albany, NY (US); Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 5 days.

(21) Appl. No.: 15/469,701

(22) Filed: Mar. 27, 2017

(65) Prior Publication Data

US 2018/0277430 A1 Sep. 27, 2018

(51) Int. Cl.
*H01L 21/764* (2006.01)
*H01L 21/768* (2006.01)

(52) U.S. Cl.
CPC ...... *H01L 21/76879* (2013.01); *H01L 21/764* (2013.01); *H01L 21/7682* (2013.01); *H01L 21/7685* (2013.01); *H01L 21/76802* (2013.01)

(58) Field of Classification Search
CPC .......................... H01L 21/764; H01L 21/7682
See application file for complete search history.

(56) References Cited

U.S. PATENT DOCUMENTS

| 9,064,801 | B1* | 6/2015 | Horak | .................. | H01L 21/283 |
| 2012/0104512 | A1* | 5/2012 | Horak | ................ | H01L 29/4983 |
| | | | | | 257/401 |
| 2013/0075821 | A1* | 3/2013 | Baars | ................ | H01L 29/66545 |
| | | | | | 257/368 |
| 2014/0110798 | A1* | 4/2014 | Cai | ........................ | H01L 29/78 |
| | | | | | 257/410 |
| 2014/0273385 | A1* | 9/2014 | Liang | ................ | H01L 21/28008 |
| | | | | | 438/299 |
| 2016/0365426 | A1* | 12/2016 | Ching | ................ | H01L 29/6656 |

* cited by examiner

*Primary Examiner* — Charles D Garber
*Assistant Examiner* — Alia Sabur
(74) *Attorney, Agent, or Firm* — Amerson Law Firm, PLLC (57) ABSTRACT

One method includes performing an etching process to define a gate cavity that exposes an upper surface and at least a portion of the sidewalls of a gate structure and forming a replacement spacer structure adjacent the exposed sidewalls of the gate structure, wherein the replacement spacer structure exposes a portion of the upper surface of the gate structure and includes at least one air space. In this example, the method also includes forming a conformal etch stop layer and a replacement gate cap structure in the gate cavity, selectively removing a portion of the replacement gate cap structure and a portion of the conformal etch stop layer so as to thereby expose the upper surface of the gate structure, and forming a conductive gate contact structure (CB) in the conductive gate contact opening, wherein the entire conductive gate contact structure (CB) is positioned vertically above the active region.

20 Claims, 11 Drawing Sheets

METHODS OF FORMING AN AIR GAP ADJACENT A GATE OF A TRANSISTOR AND A GATE CONTACT ABOVE THE ACTIVE REGION OF THE TRANSISTOR

BACKGROUND OF THE INVENTION

1. Field of the Invention

The present disclosure generally relates to the fabrication of integrated circuits, and, more particularly, to various methods of forming an air gap adjacent a gate of a transistor and a gate contact above the active region of the transistor and the resulting device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels of metal lines. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

Figure 1A:
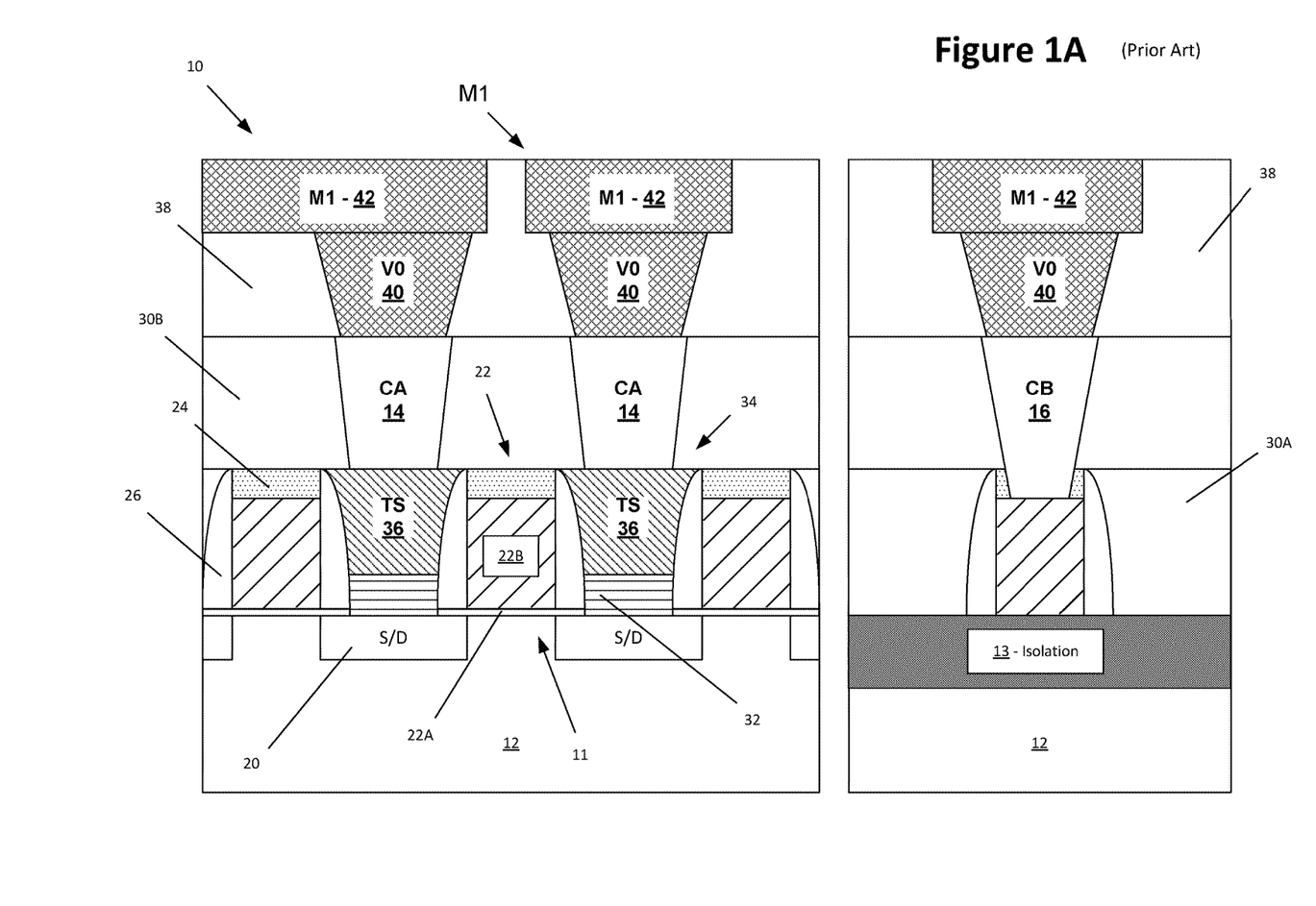
FIGS. 1A-1B depict various illustrative prior art arrangements of device-level contacts and metallization layers for an integrated circuit product.
Figure 1B:
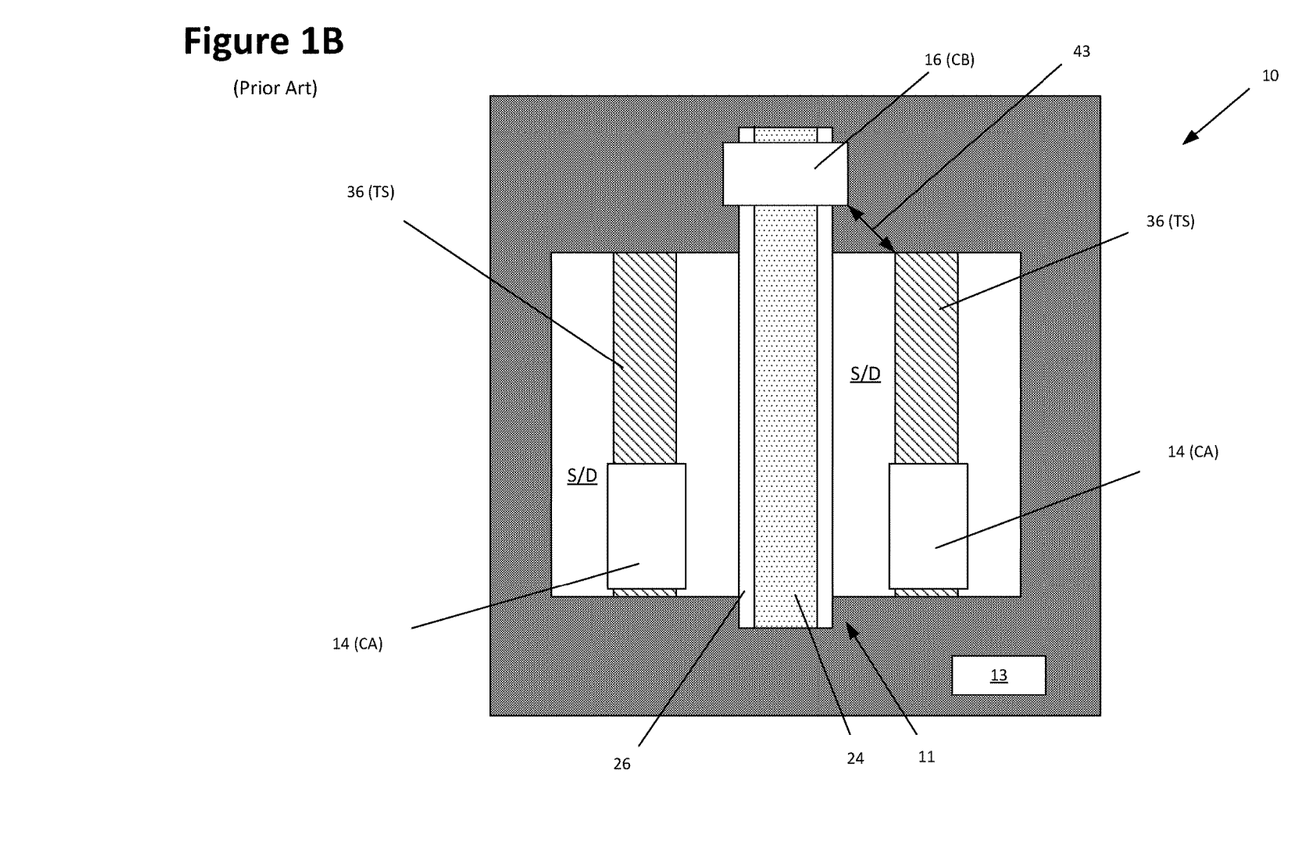

FIG. 1A is a cross-sectional view of an illustrative integrated circuit product 10 comprised of a plurality of transistor devices 11 formed in and above a semiconductor substrate 12. FIG. 1B is a simplistic plan view of a single transistor device 11. These drawings depict a plurality of so-called "CA contact" structures 14 for establishing electrical connection to the simplistically depicted source/drain regions 20 of the device 11, and a gate contact structure 16, which is sometimes referred to as a "CB contact" structure, that is formed so as to establish electrical contact to the gate structure of the transistor device. As shown in FIG. 1B, the CB gate contact 16 is typically positioned vertically above the isolation material 13 that surrounds the device 11, i.e., the CB gate contact 16 is typically not positioned above the active region defined in the substrate 12, but it may be in some advanced architectures.

With reference to FIGS. 1A-1B, the transistors 11 comprise an illustrative gate structure 22, i.e., a gate insulation (dielectric) layer 22A and a gate electrode 22B, a gate cap 24, a sidewall spacer 26 and simplistically depicted source/drain regions 20. As noted above, the isolation region 13 has also been formed in the substrate 12 at this point in the process flow. At the point of fabrication depicted in FIG. 1A, layers of insulating material 30A, 30B, i.e., interlayer dielectric materials, have been formed above the substrate 12. Other layers of material, such as contact etch stop layers and the like, are not depicted in the attached drawings. Also depicted are illustrative raised epi source/drain regions 32 and source/drain contact structures 34 which typically include a so-called "trench silicide" (TS) structure 36. The CA contact structures 14 may be in the form of discrete contact elements, i.e., one or more individual contact plugs having a generally square-like shape (as shown in FIG. 1B) or cylindrical shape when viewed from above, that are formed in an interlayer dielectric material. In other applications (not shown in FIG. 1B), the CA contact structures 14 may also be a line-type feature that contacts underlying line-type features, e.g., the TS structure 36 that contacts the source/drain region 20 (the TS structure 36 is a line-type feature that typically extends across the entire active region on the source/drain region 20 in a direction that is parallel to that of the gate structure 22). The TS structures 36, CA contacts 14 and the CB contact 16 are all considered to be device-level contacts within the industry.

In one embodiment, the process flow of forming the TS structures 36, CA contacts 14 and CB contacts 16 may be as follows. After the first layer of insulating material 30A is deposited, TS openings are formed in the first layer of insulating material 30A that expose portions of underlying source/drain regions 20. Thereafter, a traditional metal silicide region is formed through the TS openings, followed by forming tungsten (not separately shown) on the metal silicide regions, and performing a chemical mechanical polishing (CMP) process down to the top of the gate cap layer 24. Then, the second layer of insulating material 30B is deposited and contact openings for the CA contacts 14 are formed in the second layer of insulating material 30B that expose portions of the underlying tungsten metallization above the source/drain regions 20. Next, while the opening for the CA contacts 14 is masked, the opening for the CB contact 16 is formed in the second layer of insulating material 30B and through the gate cap layer 24 so as to expose a portion of the gate electrode 22B. Typically, the CB contact 16 may be in the form of a round or square plug. Thereafter, the conductive CA contacts 14 and the conductive CB contact 16 are formed in their corresponding openings in the second layer of insulating material 30B by performing one or more common metal deposition and CMP process operations, using the second layer of insulating material 30B as a polish-stop layer to remove excess conductive material positioned outside of the contact openings. The CA contacts 14 and CB contact 16 typically contain a uniform body of metal, e.g., tungsten, and may also include one or more metallic barrier layers (not shown) positioned between the uniform body of metal and the layer of insulating material 30B. As noted above, the source/drain contact structures 34, the CA contacts 14 and the CB contact 16 are all considered to be device-level contacts within the industry.

With continuing reference to FIG. 1A, a portion of the multi-level metallization system for the IC product 10 is depicted. More specifically, FIG. 1A depicts an illustrative example of a so-called M1 metallization layer of the multi-level metallization system. The M1 metallization layer is formed in a layer of insulating material 38, e.g., a low-k insulating material. The M1 metallization layer typically includes a plurality of metal lines 42 that are routed as needed across the IC product 10. A plurality of conductive vias—so-called V0 vias 40—are formed so as to establish electrical connection between the M1 metallization layer and the device-level contacts—CA contacts 14 and the CB contact 16. The metallization lines 42 are typically formed by forming long continuous trenches in the layer of insulating material 38 across substantially the entire substrate. Thereafter, these trenches are filled with one or more conductive materials and one or more chemical mechanical polishing (CMP) processes are performed to remove excessive conductive materials outside of the trenches.

FIG. 1B is a simplistic plan view of the illustrative transistor device 11 just showing the device level contacts—the CA contacts 14 and the CB contact 16—and their relative locations for the device 11. Also depicted in FIG. 1B is the gate cap layer 24, a sidewall spacer 26 and the trench silicide structures 36 formed above the source/drain regions 20. As noted above, the entire CB gate contact 16 is positioned vertically above the isolation region 13 that surrounds the product 10, i.e., the CB gate contact 16 is not positioned above the active region defined in the substrate 12. The CB gate contact 16 is typically positioned above the isolation region 13 so as to avoid or reduce the chances of creating an electrical short between the CB contact 16 and the TS structure 36, i.e., there is a minimum spacing 43 that must be maintained between these two structures according to various design rules in an attempt to prevent such electrical shorts. Unfortunately, there is an area penalty associated with the requirement that the CB contact 16 only be positioned above the isolation region 13. What is needed is a method for forming the CB gate contact 16 above the active region of the device so as to conserve valuable plot space on an integrated circuit product.

With reference to FIG. 1A, the spacers 26 are typically made of silicon nitride which has a relatively high k value of, e.g., about 7-8. As a result of the physical configuration of the transistor 10, a gate-to-contact capacitor is defined, wherein the gate electrode 22B functions as one of the conductive plates of the capacitor, the self-aligned trench silicide structures 36 function as the other conductive plate of the capacitor and the spacer 26 is positioned between the two conductive plates. This gate-to-contact capacitor is parasitic in nature in that this capacitor must charge and discharge every time the transistor device 11 is turned on and off, all of which results in delaying the switching speed of the device 11.

Device designers have made efforts to reduce the parasitic gate-to-contact capacitor. For example, some process flows have been developed for forming the spacer 26 of a material having a lower k value than that of silicon nitride so as to reduce the capacitance. Another technique that has been employed is to form air gaps or spaces in the spacer 26 so as to reduce the k value of the spacer. However, incorporating the formation of such an air gap spacer into complex process flows can be problematic and expensive and may result in reduced product yields.

The present disclosure is directed to various methods of forming an air gap adjacent a gate of a transistor and a gate contact above the active region of the transistor and the resulting device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming at least one air gap or space adjacent a gate of a transistor and a gate contact above the active region of the transistor and the resulting device. One illustrative method disclosed includes, among other things, forming a gate cavity that exposes the upper surface and at least a portion of the sidewalls of the gate structure and forming a replacement spacer structure above the recessed sidewall spacer and adjacent the exposed sidewalls of the gate structure, wherein the replacement spacer structure exposes a portion of the upper surface of the gate structure and comprises at least one air space positioned adjacent at least one of the sidewalls of the gate structure. In this example, the method also includes forming a replacement gate cap structure in the gate cavity, the replacement gate cap structure comprising a gate cap material positioned above a conformal etch stop layer, forming a conductive gate contact opening that is positioned vertically above the active region by selectively removing a portion of the gate cap material and a portion of the conformal etch stop layer so as to thereby expose at least a portion of the upper surface of the gate structure, and forming the conductive gate contact structure (CB) in the conductive gate contact opening, wherein the entire conductive gate contact structure (CB) is positioned vertically above the active region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming at least one air gap, i.e., an air gap spacer, adjacent at least one sidewall of the gate structure of a transistor and a conductive gate contact structure (CB) for the transistor above the active region as well as the resulting device. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2A:
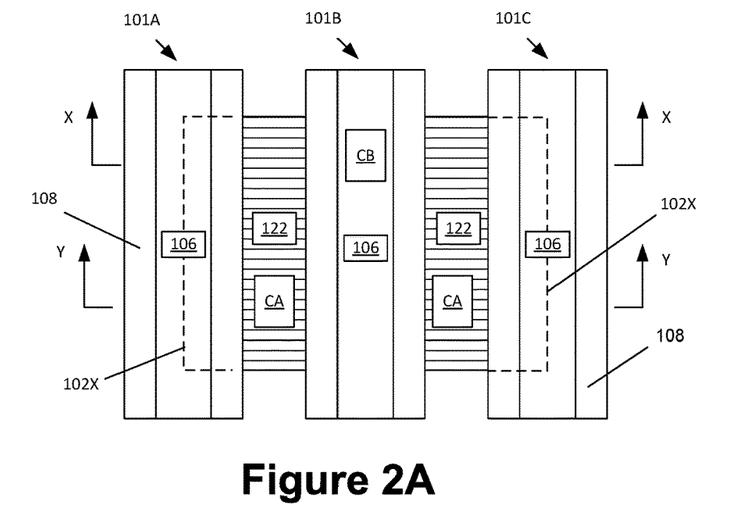
FIGS. 2A-2R depict various novel methods disclosed herein for forming at least one air gap adjacent a gate of a transistor and a gate contact above the active region of the transistor and the resulting device.
Figure 2B:
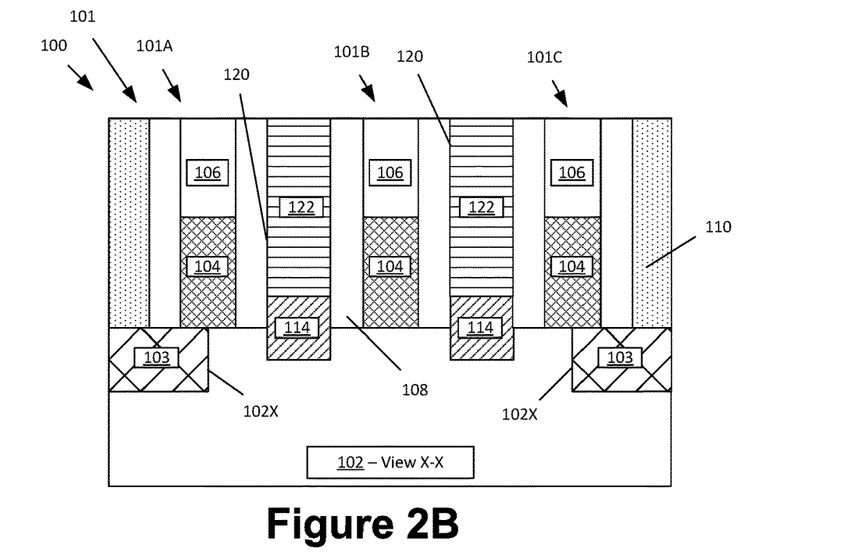
Figure 2C:
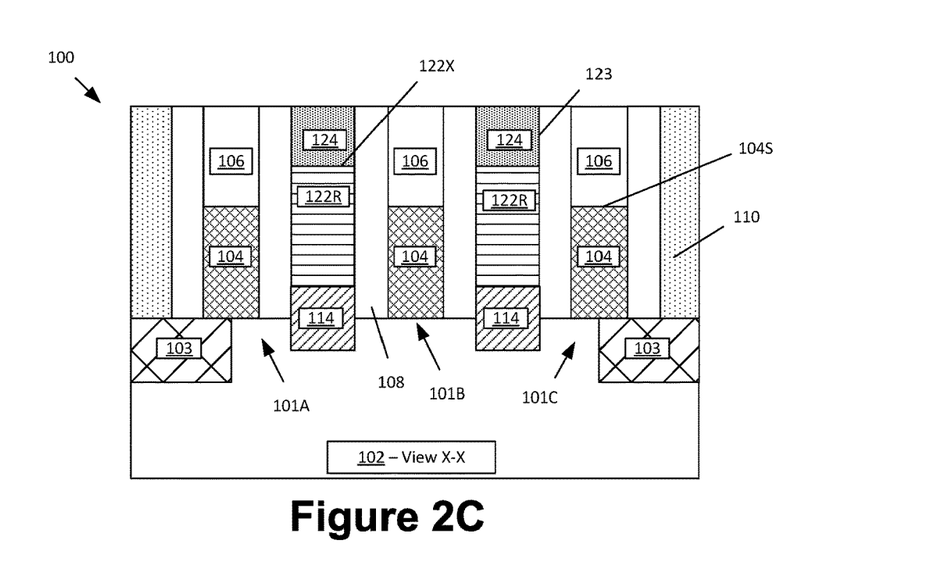
Figure 2D:
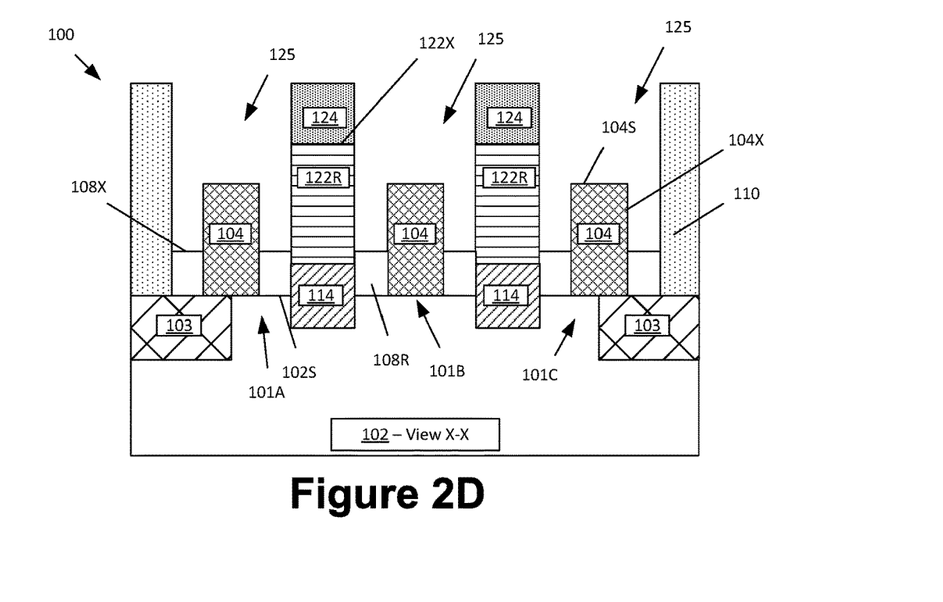
Figure 2E:
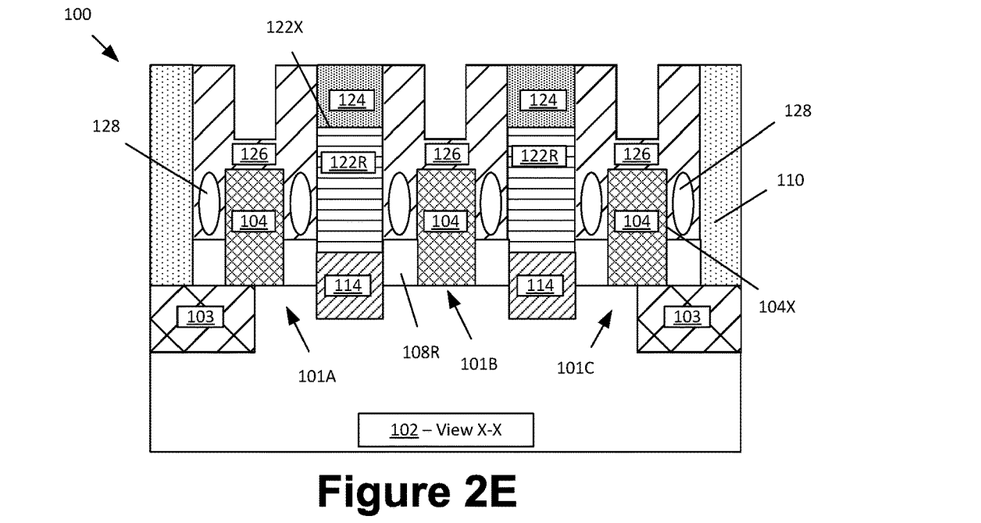
Figure 2F:
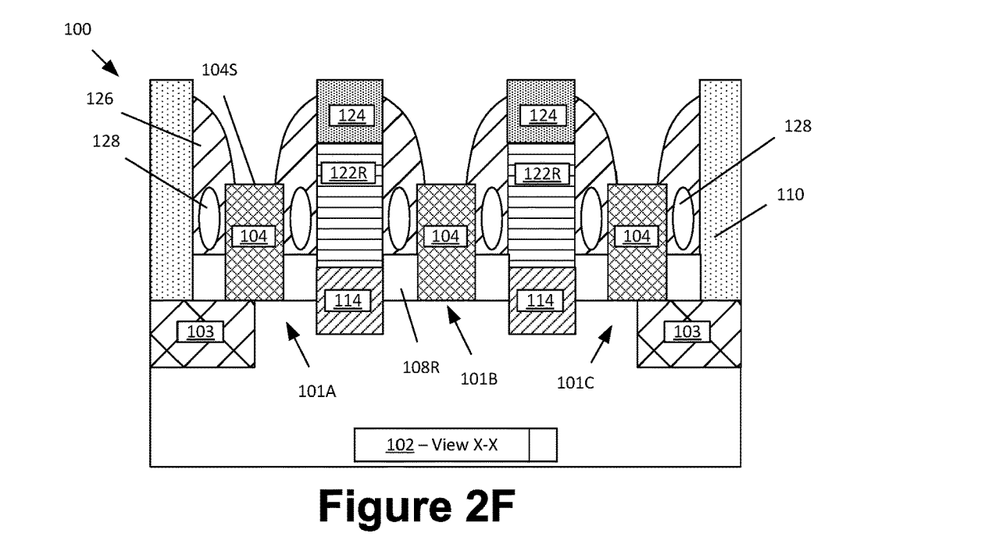
Figure 2G:
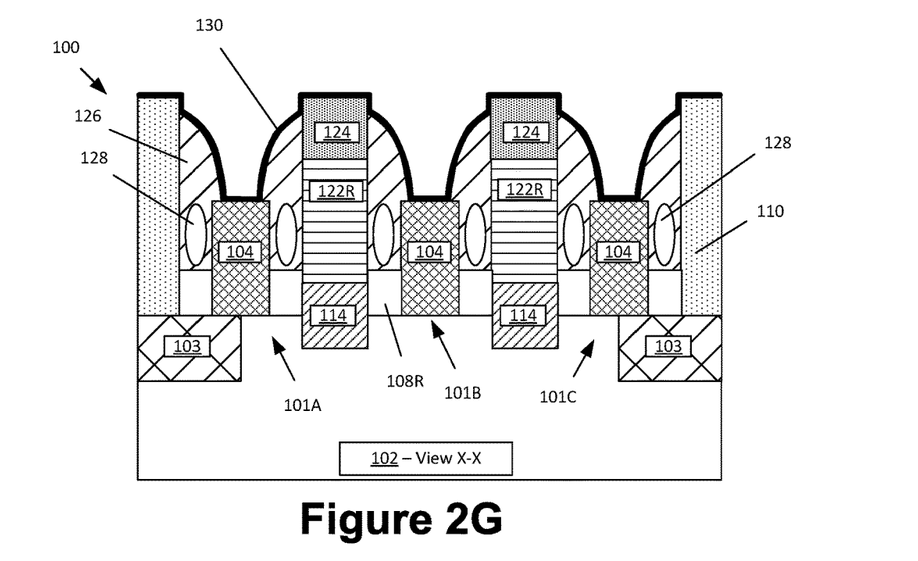
Figure 2H:
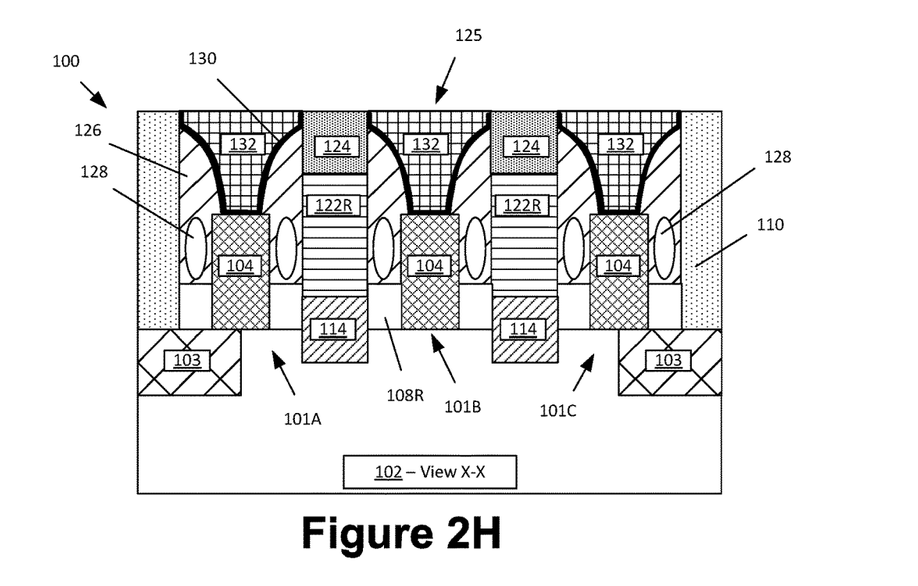
Figure 2I:
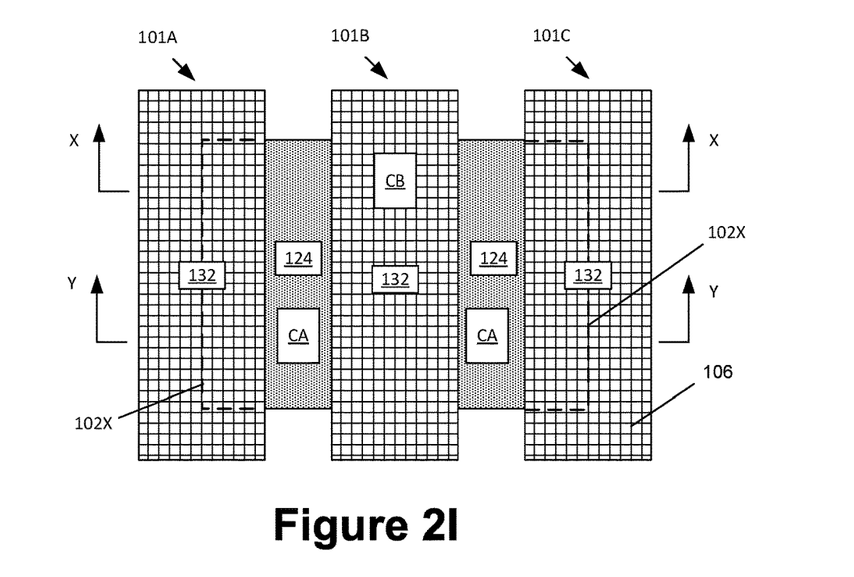
Figure 2J:
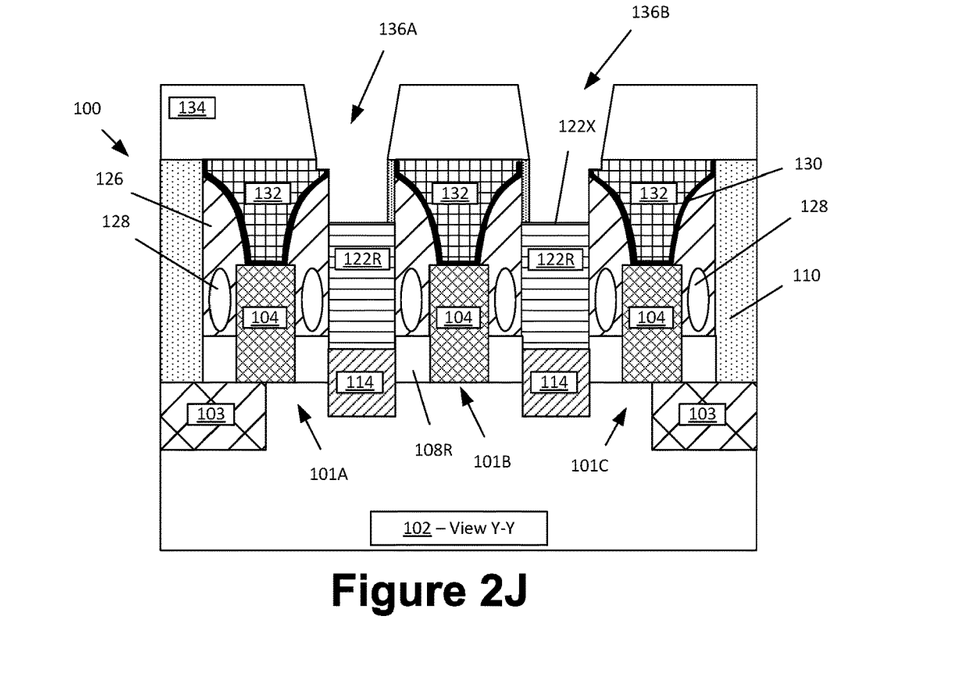
Figure 2K:
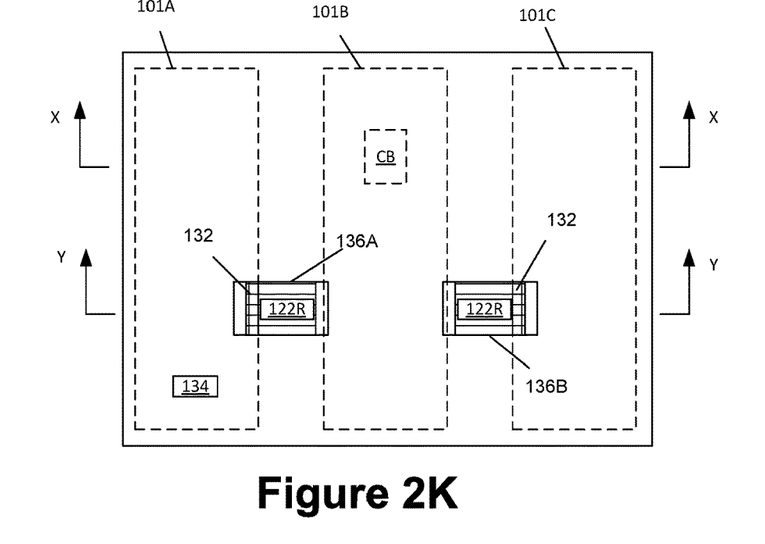
Figure 2L:
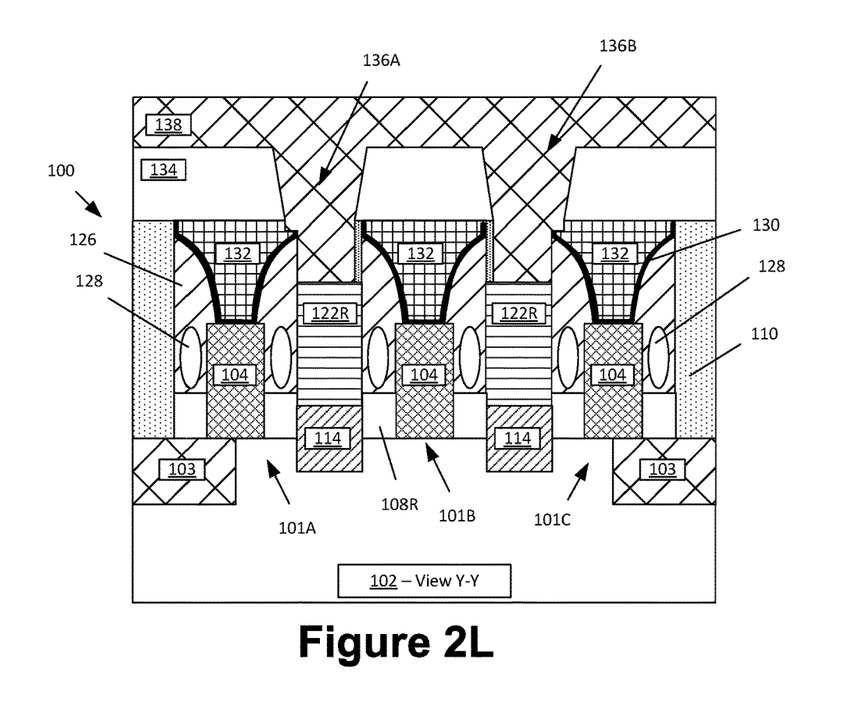
Figure 2M:
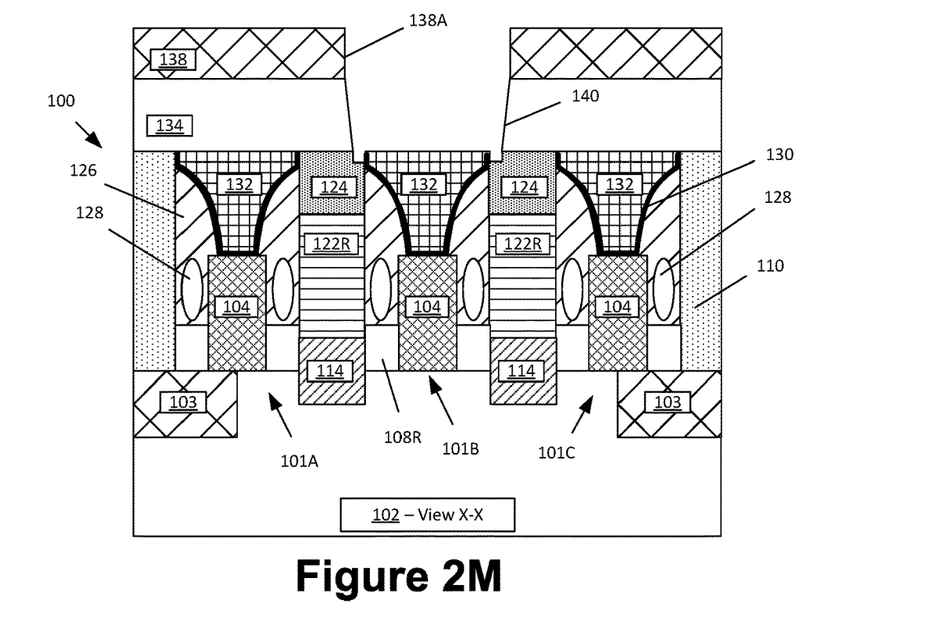
Figure 2N:
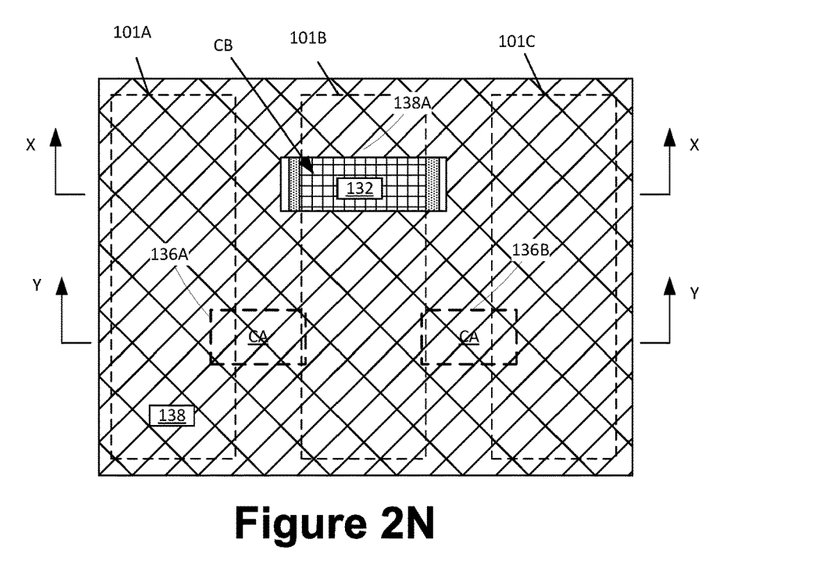
Figure 2O:
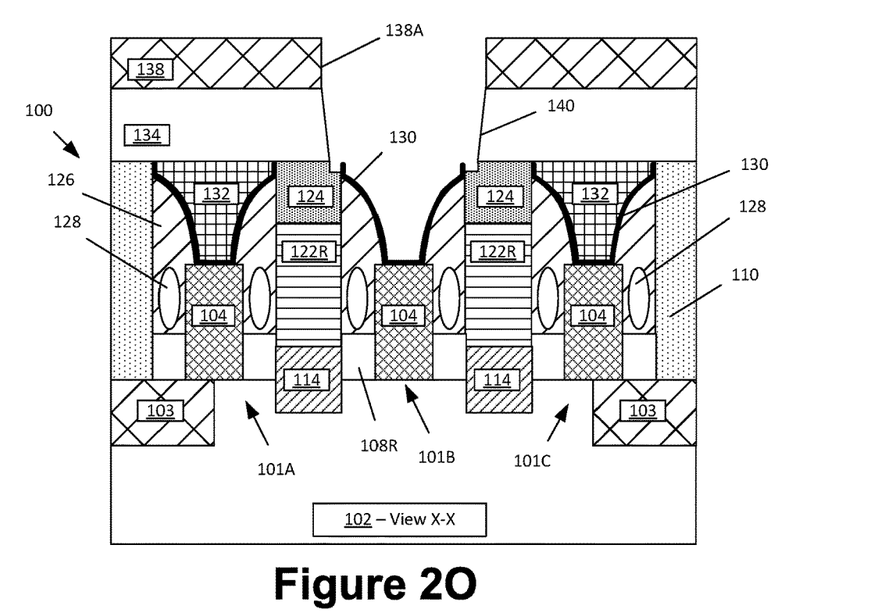
Figure 2P:
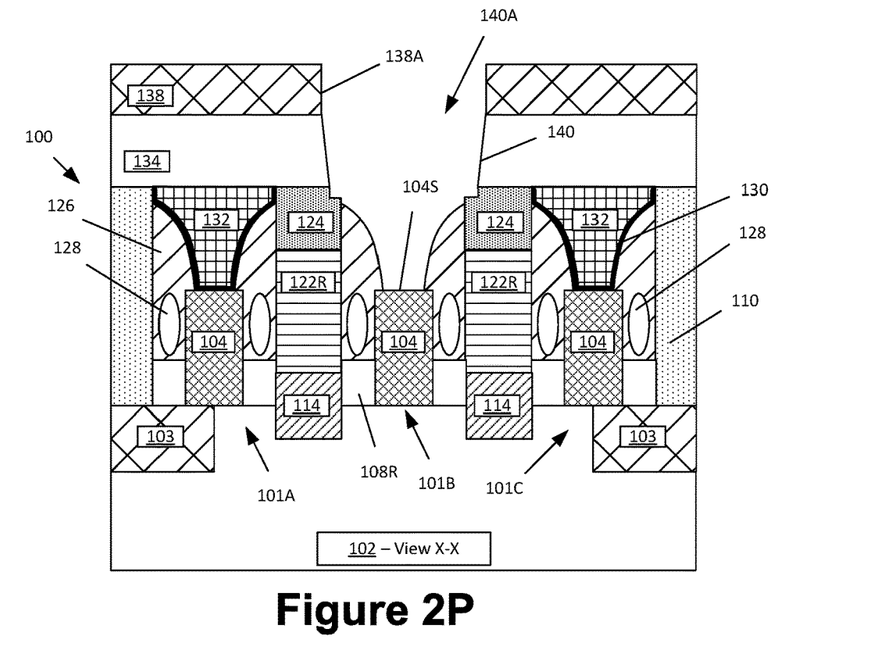
Figure 2Q:
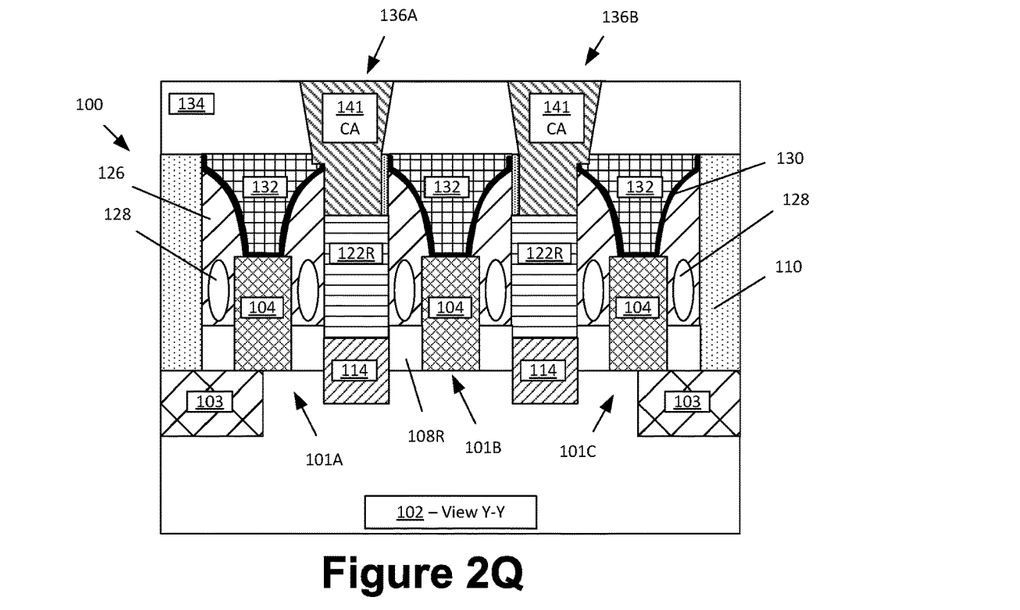
Figure 2R:
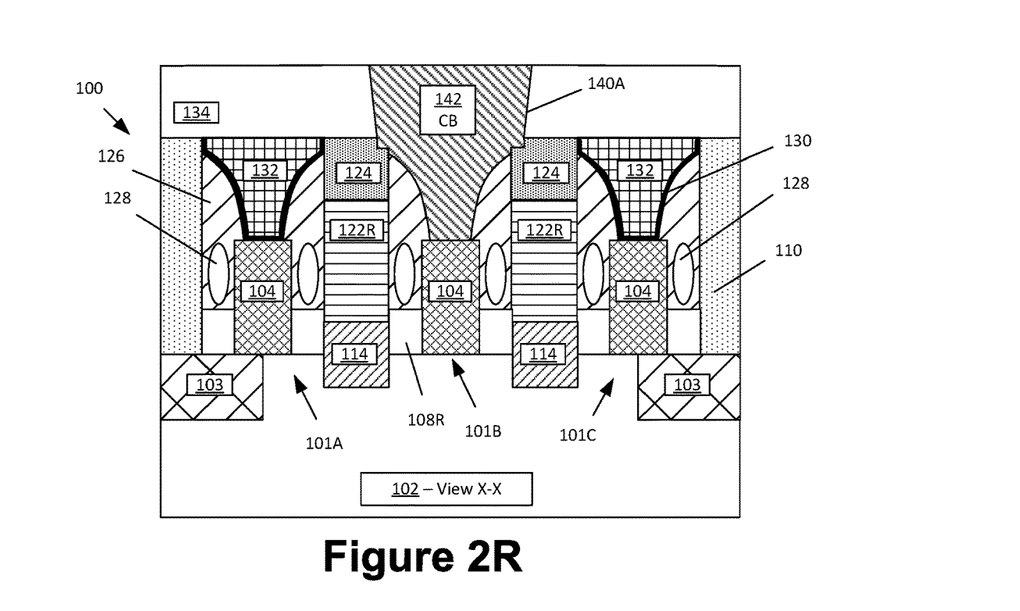

FIGS. 2A-2R depict various novel methods disclosed herein for forming a conductive gate contact structure (CB) for a transistor above the active region and an air gap, i.e., an air gap spacer, adjacent at least one sidewall of the gate structure of the transistor formed on an integrated circuit (IC) product 100. FIG. 2A depicts a simplistic plan view showing where various cross-sectional views are taken in the drawings. FIG. 2A also depicts where an illustrative conductive gate contact structure (CB) and a plurality of illustrative conductive source/drain contact structures (CA) will eventually be formed above the active region of the device 101B. As indicated in FIG. 2A, the view X-X is a cross-sectional view taken through the device (in a direction corresponding to the gate length direction of the device) at a location where the conductive gate contact structure (CB) will eventually be formed, while the view Y-Y is a cross-sectional view taken through the device (in a direction corresponding to the gate length direction of the device) at a location where the illustrative conductive source/drain contact structures (CA) will eventually be formed. It should also be noted that several drawings are plan views of the product 100 that reflect at least some aspects of the processing at various points during the process flows disclosed herein. However, the plan views may not depict all of the processing details shown in the related cross-sectional views so as to not overly complicate the drawings.

With reference to FIGS. 2A-2B, the illustrative product 100 will be formed in and above the semiconductor substrate 102. In this example, the IC product 100 comprises three illustrative laterally spaced-apart gates 101A-C (collectively referenced using the numeral 101) that were formed above the substrate 102. The product 100 may comprise either NMOS transistors, PMOS transistors or both types of transistors. The transistors may be of any desired configuration, e.g., FinFET devices, planar devices, etc. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

FIGS. 2A-2B depict the product 100 at a point in fabrication wherein several process operations have been performed. First, an isolation region 103 was formed in the substrate 102 so as to define an active region (102X) where a transistor device will be formed. Next, a plurality of illustrative final gate structures 104, one for each of the gates 101, was formed above the substrate 102. Each of the gates 101 includes the schematically depicted final gate structure 104, an initial sidewall spacer 108 and an initial gate cap layer 106. The initial sidewall spacer 108 was formed by performing a conformal deposition process to form a conformal layer of spacer material, e.g., silicon nitride, above the substrate 102 and thereafter performing an anisotropic etching process. The final gate structure 104 typically includes a gate insulation layer (not separately shown), such as silicon dioxide or a high-k (k value greater than 10) insulating material, and one or more layers of conductive material (not separately shown) that act as the gate electrode, e.g., a metal, a metal alloy, titanium nitride, tantalum nitride, tungsten, aluminum, polysilicon, etc. The sidewall spacer 108 and the gate cap layer 106 are typically comprised of silicon nitride. The final gate structure 104 may be formed using well-known "gate first" or "replacement gate" manufacturing techniques. Of course, those skilled in the art will appreciate that, in some applications, one or more of the gate 101A-C may span across several spaced-apart active regions that are separated by the isolation material 103. In the view depicted in FIG. 2B, the gate 101B is the "active gate" for the active transistor device that is formed above the active region 102X, while the gates 101A and 101C serve as so-called dummy gates. In a real-world IC product 100, there may be many active gates and/or dummy gates formed across a single active region. Thus, the subject matter disclosed herein should not be considered to be limited to the simplistic examples depicted herein.

Also depicted are regions of optional epi semiconductor material 114 that was formed in the source/drain regions of the transistor device. The epi semiconductor material 114 need not be formed in all applications. The physical size of the final gate structures 104 and the gate pitch for the final gate structures 104 may vary depending upon the particular application. Also depicted in FIG. 2B is layer of insulating material 110, e.g. silicon dioxide that was deposited above the substrate 102 between the laterally spaced-apart gates 101. A planarization process (e.g., a chemical mechanical planarization (CMP) process) was performed on the layer of insulating material 110 using the initial gate cap layers 106 as a polish-stop. This process operation exposes the upper surface of the initial gate cap layers 106. Other layers of material that may be present, such as a conformal contact etch stop layer that is formed above the epi material 114, are not depicted in the drawings so as to not overly complicate the drawings.

With continuing reference to FIGS. 2A-2B, the next major operation involved forming a plurality of initial conductive source/drain metallization structures 122 so as to enable electrical contact with each of the individual source/drain regions of the devices. One illustrative process flow for forming the initial conductive source/drain metallization structures 122 is as follows. First, a patterned etch mask (not shown) is formed with an opening that exposes portions of the layer of insulating material 110 positioned above the source/drain region, e.g., above the epi material 114. Next, one or more etching processes were performed through the patterned etch mask to selectively remove the exposed portions of the layer of insulating material 110 relative to the surrounding materials and expose the underlying source/drain regions. This process operation defines a plurality of source/drain contact cavities 120 above the epi material 114. Then, the patterned etch mask was removed.

At that point, the plurality of initial conductive source/drain metallization structures 122 were formed on the product 100 in the source/drain contact cavities 120. The initial conductive source/drain metallization structures 122, e.g., trench silicide containing regions, contact the raised epi source/drain regions 114 (the source/drain regions) and constitute the conductive source/drain metallization structures that will eventually be conductively coupled to the conductive source/drain contact structures (CA) that are to be subsequently formed on the product 100. Typically, a pre-clean process may be performed prior to forming metal silicide regions (not shown) that physically contact the raised epi material 114. Next, a simplistically depicted initial conductive source/drain metallization structure 122 was formed in each of the source/drain contact cavities 120 so as to establish contact to their respective source/drain region of the transistor devices. As noted above, the initial conductive source/drain metallization structures 122 (irrespective of their precise configuration and the manner in which they are made) provide an electrical path between the source/drain regions of the devices (including the raised epi source/drain regions 114) and the conductive source/drain contact structures (CA) that are to be subsequently formed for the product 100. The configuration and structure of the initial conductive source/drain metallization structures 122 may vary depending upon the particular application. In one example, the initial conductive source/drain metallization structures 122 are line-type structures that extend into and out of the drawing page in FIG. 2B that extend for substantially the entire length of the active region (in a direction that corresponds to the gate width direction of the device), as shown in the plan view (FIG. 2A). In some cases, the initial conductive source/drain metallization structures 122 comprise a trench metal silicide material (not separately shown) that is formed on and in contact with the raised epi source/drain regions 114, and a metal material, such as tungsten (not separately shown), that is formed on and in contact with the trench metal silicide material. After the formation of the materials that make up the initial conductive source/drain metallization structures 122, a chemical mechanical polishing (CMP) process was performed to remove excess materials located above the upper surface of the initial gate cap layers 106.

FIG. 2C depicts the product 100 after several process operations were performed. First, a timed, recess etching process was performed on the initial conductive source/drain metallization structures 122 so as to define a plurality of recessed conductive source/drain metallization structures 122R having a recessed upper surface 122X that is, in one illustrative embodiment, positioned at a level that is above the level of an upper surface 104S of the final gate structures 104, e.g., by a distance of about 5-20 nm. Of course, the amount of recessing of the initial conductive source/drain metallization structures 122 may vary depending upon the particular application. In general, less recessing of the initial conductive source/drain metallization structures 122 will result in recessed conductive source/drain metallization structures 122R having less resistance, i.e., a benefit to transistor performance. This process operation results in the formation of a cavity 123 above each of the recessed conductive source/drain metallization structures 122R. Thereafter, an insulating material 124 was formed in the cavity 123 above each of the recessed conductive source/drain metallization structures 122R. In one illustrative example, this may be accomplished by depositing a layer of the insulating material 124, e.g. silicon dioxide, above the substrate 102 so as to over-fill the cavities 123 and thereafter performing one or more CMP processes using the initial gate cap layers 106 as a polish-stop. This process removes excess portions of the layer of insulating material 124 positioned outside of the cavities 123. In some applications, the layer of insulating material 124 may be comprised of the same material as that of the layer of insulating material 110, but that may not be the case in all applications.

FIG. 2D depicts the product 100 after one illustrative process flow wherein a timed, recess etching process was performed on the product 100 to remove the initial gate cap layers 106 and a portion of the vertical height of the initial spacers 108 so as to define a plurality of recessed sidewall spacers 108R having a recessed upper surface 108X. In another illustrative process flow, the entirety of the initial spacers 108 may be removed so as to expose the underlying substrate 102 (or fin 102 in the case of a FinFET device). Irrespective of the process flow used, this process operation results in the formation of a recessed gate cavity 125 whereby each of the recessed gate cavities 125 exposes at least the upper surface 104S of the corresponding final gate structure 104 and at least a portion of the vertical height of the sidewalls 104X of the corresponding final gate structures 104, and, in some cases, the entirety of the vertical height of the sidewalls 104X of the final gate structures 104. The amount of recessing of the vertical height of the initial spacers 108 may vary depending upon the particular application. In one illustrative embodiment, the recess etching process is performed for a duration such that the recessed upper surface 108X of the recessed spacers 108R is approximately 5-20 nm above the upper surface 102S of the substrate 102 (or upper surface of fin 102 if the device is a FinFET device). Note that, in one embodiment, the recessed spacer structures 108R extend along substantially the entire gate-width direction of the devices 101 (i.e., into and out of the plane of the drawing page in FIG. 2D) and around the entire perimeter of the gate structure 104 for each of the gates 101, i.e., a portion of the vertical height of the sidewall surfaces of the gate structures 104, a portion of the vertical height of the opposing end surfaces (not shown in FIG. 2D) of the gate structures 104 and the entire upper surface 104S of the gate structures are exposed. In the case where the entirety of the initial spacers 108 is removed, then substantially the entire vertical height of the sidewall surfaces of the gate structures 104, substantially the entire vertical height of the opposing end surfaces (not shown in FIG. 2D) of the gate structures 104 and the entire upper surface 104S of the gate structures are exposed. For ease of disclosure, the following drawings will depict the illustrative process flow where the initial spacers 108 are recessed and recessed spacers 108R remain in position on the device, with the understanding that, if desired, the entirety of the initial spacers 108 may be removed as described above. Additionally, if desired, a patterned masking layer (not shown) that exposes only the portions of at least the active gate 101B (and perhaps dummy gates 101A and 101C) positioned above the active region 102X may be formed prior to formation of the gate cavities 125. In such a case, the gate cavities 125 would only extend for a distance that corresponds to the entire gate-width direction of the devices 101 (i.e., into and out of the plane of the drawing page in FIG. 2D) and such gate cavities 125 would not be formed around the ends of the gates 101 that are positioned above the isolation material 103.

FIG. 2E depicts the product 100 after replacement gate spacer structures 126 with at least one air gap or space 128 formed therein were formed in the gate cavities 125 adjacent the gate structures 104 of the devices 101 above the recessed spacers 108R. The at least one air gap 128 is positioned adjacent at least one sidewall 104X of the gate structure 104. The material for replacement gate spacer structures 126 is deposited across the substrate 102 and in the gate cavities 125 in such a manner that the material for the replacement gate spacer structures 126 "pinches-off" and does not completely fill the spaces adjacent the sidewalls of the gate structures 104 above the recessed sidewall spacers 108R. As one example, the material for replacement gate spacer structures 126 may be formed by performing a traditional CVD process or a PVD process followed by performing a CVD process, wherein the deposition process is performed, at least initially, to be less conformal in nature so as to encourage "pinch-off". After the air gap or space 128 is formed, the deposition process may be adjusted so as to be more conformal in nature. In one embodiment, this results in the formation of a single continuous air gap 128 (i.e., an air gap spacer) located adjacent the sidewalls 104X of each gate structure 104 above the recessed sidewall spacers 108R and around the entire perimeter of the gate structure 104. The vertical extent (or height) and the lateral width of the air space 128 may vary depending upon the application and the manner in which the deposition process is performed to form the material of the replacement gate spacer structures 126. As noted above, if a process flow is selected that involves forming the gate cavities 125 only above the active region 102X and not around the ends of the gates 101, the air gap 128 would also not be formed around the entire perimeter of the gate structure 104. Rather, in such a case, when looking at a single device, there would be two non-connected air gaps 128 that are formed adjacent opposite sidewalls of the gate structure 104, i.e., the air gaps 128 would not be formed around the ends of the gates 101 that are positioned above the isolation material 103.

The replacement gate spacer structures 126 may be comprised of a variety of different materials, e.g., silicon nitride, etc. However, the replacement gate spacer structures 126 should be made of a material that exhibits sufficient etch selectivity relative to the surrounding materials, e.g., the gate structures 104, the insulating material 110 and the insulating material 124, to facilitate the processing that is described more fully below.

FIG. 2F depicts the product 100 after a timed, directional, anisotropic etching process was performed on the replacement gate spacer structures 126. This process operation exposes at least a portion of the upper surface 104S of each of the gate structures 104.

The next series of process operations will involve the formation of a gate cap structure in the gate cavities 125 above the replacement gate spacer structures 126. Accordingly, FIG. 2G depicts the product 100 after a conformal etch-stop layer 130 was deposited on the product 100 and in the gate cavities 125 by performing a conformal deposition process, such as a conformal ALD process. In the depicted example, the etch-stop layer 130 is deposited so as to contact all exposed surfaces of the product 100 including the replacement gate spacer structures 126 and the exposed upper surface 104S of each of the gate structures 104. The etch-stop layer 130 may be formed to any desired thickness, e.g., 2-6 nm, and it may be formed from any desired material, e.g., $HfO_2$, $Al_2O_3$, AlN, etc. However, the etch-stop layer 130 should be made of a material that exhibits sufficient etch selectivity relative to the surrounding materials, e.g., the gate structures 104, the insulating material 110, the insulating material 124 and the replacement gate spacer structures 126, to facilitate the processing that is described more fully below.

FIG. 2H (cross-sectional side view) and FIG. 2I (plan view) depict the product 100 after several process operations were performed so as to form a replacement gate cap material 132 above the etch-stop layer 130 and in the remaining un-filled portion of gate cavity 125 for each of the devices 101. No attempt has been made to show the etch-stop layer 130 in the FIG. 2I (plan view) so as to not overly complicate the drawings. In one illustrative process flow, the replacement gate cap material 132 was deposited across the substrate 102 so as to over-fill the remaining portions of the gate cap cavities 125. Then, a planarization process (e.g., a chemical mechanical planarization (CMP) process) was performed using the insulating materials 110 and 124 as a polish-stop, thereby removing excess portions of the etch-stop layer 130 and the replacement gate cap material 132 positioned above the upper surface of the insulating materials 110 and 124. The replacement gate cap material 132 may be any desired material, e.g., silicon nitride, SiBCN, etc. However, the replacement gate cap material 132 should be made of a material that exhibits sufficient etch selectivity relative to the surrounding materials, e.g., the insulating material 110, the insulating material 124 and the etch-stop layer 130, to facilitate the processing that is described more fully below. Collectively, the etch-stop layer 130 and the replacement gate cap material 132 constitute a replacement gate cap structure.

In the illustrative process flow depicted herein, the next major processing operation will involve the formation of a plurality of illustrative conductive source/drain contact structures (CA) and a conductive gate contact structure (CB) above the active region 102X. In the illustrative process flow depicted herein, the openings for conductive source/drain contact structures (CA) are formed prior to formation of the opening for the conductive gate contact structure (CB). However, as will be appreciated by those skilled in the art after a complete reading of the present application, this order of processing could be reversed if desired.

Accordingly, FIG. 2J (cross-sectional side view) and FIG. 2K (plan view) depict the product 100 after several process operations were performed to form illustrative CA contact openings 136A, 136B for the product 100. In one illustrative process flow, a layer of insulating material 134, e.g., silicon dioxide, was deposited above the product 100 and a CMP process was performed on its upper surface. Thereafter a patterned etch mask (not shown), e.g., a patterned CA contact etch mask, was formed above the layer of insulating material 134. Then, one or more etching processes were performed through the patterned CA contact etch mask to remove exposed portions of the layer of insulating material 134 and the exposed portions of the layer of insulating material 124 so as to define the CA contact openings 136A, 136B that expose at least a portion of the upper surface 122X of the recessed conductive source/drain metallization structures 122R positioned on opposite sides of the gate 101B.

FIG. 2L (cross-sectional side view at location Y-Y), FIG. 2M (cross-sectional side view at location X-X) and Figure N (plan view), depict the product 100 after a patterned CB masking layer 138, e.g., OPL, photoresist, etc., was formed above the product 100. Note that, as shown in FIG. 2L, the patterned CB masking layer 138 over-fills the previously formed CA contact openings 136A, 136B. However, as shown in FIGS. 2M-2N, the CB masking layer 138 has an opening 138A that located above a portion of the gate 101B above the active region 102X where the conductive gate contact structure (CB) will be formed to contact the gate structure 104 of the gate 101B. Thereafter, at least one etching process was performed through the patterned CB masking layer 138 to define a first portion 140 of a CB contact opening in the layer of insulating material 134. The opening 140 exposes a portion of the replacement gate cap material 132 along the axial length of the gate 101B. Note that the insulating material 124 protects the recessed line-type conductive source/drain metallization structures 122R positioned on opposite sides of the gate 101B from being etched during this etching process.

FIG. 2O depicts the product 100 after a selective etching process was performed to selectively remove the portion of the replacement gate cap material 132 exposed by the opening 140 relative to the surrounding materials, e.g., relative to the etch-stop layer 130 and the layers of insulating material 134, 124. Note that the etch-stop layer 130 protects the gate structure 104 during this etching process.

FIG. 2P depicts the product 100 after another selective etching process was performed to selectively remove the portion of the etch-stop layer 130 relative to the surrounding materials, e.g., relative to the replacement gate spacer structures 126, the layers of insulating material 134, 124 and the gate structure 104. As depicted, this process operation defines a final CB gate contact opening 140A that exposes at least a portion of the upper surface 104S of the gate structure 104 such that a conductive CB gate contact may be formed so as to establish electrical connection to the gate structure 104 of the device 101B.

FIG. 2Q (cross-sectional side view at location Y-Y) and FIG. 2R (cross-sectional side view at location X-X) depict the product 100 after several process operations were performed to form final CA contact structures 141 and a final CB contact structure 142 for the product 100. First, the patterned CB masking layer 138 was removed. Thereafter, one or more conductive materials (perhaps including one or more barriers layers) was formed in the CA contact openings 136A, 136B and in the CB contact opening 140A at the same time so as to over-fill the openings 136A, 136B and 140A with conductive materials. Thereafter, one or more planarization processes (e.g., a chemical mechanical planarization (CMP) process) was performed using the insulating material 134 as a polish-stop, thereby removing excess portions of the conductive material positioned above the upper surface of the insulating material 134.

The CA contact structures 141 and CB contact structure 142 depicted herein are intended to be schematic and representative in nature, as they may be formed using any of a variety of different conductive materials. As noted above, the CA and CB contact structures may also contain one or more barrier layers (which are not separately depicted), e.g., Ti, TiN, that are formed by performing a conformal deposition process followed by over-filling the openings 136A, 136B and 140A with a conductive material, such as tungsten or cobalt. Thereafter, the above-mentioned one or more CMP processes may be performed to remove excess portions of the materials of the conductive CA and CB structures. At the point of processing depicted in FIGS. 2Q-2R, the product 100 may be completed by performing traditional manufacturing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a conductive gate contact structure (CB) for a transistor formed above an active region defined in a semiconducting substrate, said transistor comprising a gate structure with an upper surface and sidewalls and an initial sidewall spacer positioned adjacent said sidewalls of said gate structure, the method comprising:
    removing at least a portion of at least said initial sidewall spacer so as thereby define a gate cavity that exposes said upper surface and at least a portion of said sidewalls of said gate structure;
    forming a replacement spacer structure in said gate cavity, wherein said replacement spacer structure expose a portion of said upper surface of said gate structure and wherein at least one air space is formed in said replacement spacer structure adjacent at least a portion of at least one sidewall of said gate structure;
    forming a replacement gate cap structure in said gate cavity above said replacement spacer structure and on said exposed portion of said upper surface of said gate structure, said replacement gate cap structure comprising a gate cap material positioned above a conformal etch stop layer;
    forming a conductive gate contact opening that is positioned vertically above said active region by selectively removing a portion of said replacement gate cap structure so as to thereby expose at least a portion of said upper surface of said gate structure; and
    forming said conductive gate contact structure (CB) in said conductive gate contact opening, wherein an entirety of said conductive gate contact structure (CB) is positioned vertically above said active region.

2. The method of claim 1, wherein:
    removing said at least a portion of said at least said initial sidewall spacer comprises removing less than an entirety of said initial sidewall spacer so as to result in a recessed sidewall spacer; and
    forming said replacement spacer structure comprises forming said replacement spacer structure above said recessed sidewall spacer and adjacent said exposed sidewalls of said gate structure, wherein said at least one air space is formed in said replacement spacer structure above said recessed sidewall spacer and adjacent at least a portion of at least one sidewall of said gate structure.

3. The method of claim 1, wherein:
    removing said at least a portion of said at least said initial sidewall spacer comprises removing an entirety of said initial sidewall spacer so as to expose a portion of said substrate underlying said initial sidewall spacer; and
    forming said replacement spacer structure comprises forming said replacement spacer structure above said exposed portion of said substrate and adjacent said exposed sidewalls of said gate structure, wherein said at least one air space is formed in said replacement spacer structure above said exposed portion of said substrate and adjacent at least a portion of at least one sidewall of said gate structure.

4. The method of claim 1, wherein forming said replacement spacer structure comprises:
    depositing material for said replacement spacer structure in said gate cavity so as to thereby define said air space, wherein said material for said replacement spacer structure covers an entirety of said upper surface of said gate structure; and
    performing an anisotropic etching process on said material for said replacement spacer structure so as to remove a portion of said deposited material for said replacement spacer structure from above at least a portion of said upper surface of said gate structure.

5. The method of claim 1, wherein forming said replacement gate cap structure in said gate cavity comprises:
    depositing said gate cap material in said gate cavity and on said conformal etch stop layer, wherein said deposited gate cap material over-fills said gate cavity; and
    performing at least one planarization process to remove portions of said deposited gate cap material positioned outside of said gate cavity.

6. The method of claim 1, wherein forming said conductive gate contact opening comprises:
    forming a layer of insulating material having an opening formed therein that exposes a portion of said replacement gate cap structure positioned above said active region, wherein selectively removing said portion of said replacement gate cap structure comprises performing a first selective etching process through said opening in said layer of insulating material to remove a portion of said gate cap material selectively relative to said conformal etch stop layer and performing a second selective etching process through said opening in said layer of insulating material to remove a portion of said conformal etch stop layer so as to thereby expose said at least a portion of said upper surface of said gate structure.

7. The method of claim 1, wherein said conformal etch stop layer comprises one of $HfO_2$, $Al_2O_3$, AlN, said replacement gate cap structure comprises silicon nitride or SiBCN, said replacement spacer structure comprises silicon nitride and said conductive gate contact structure (CB) comprises at least one barrier liner layer.

8. The method of claim 1, wherein said replacement spacer structure extends around an entire perimeter of said gate structure and is partially positioned above an isolation material that surrounds said active region.

9. The method of claim 1, further comprising forming a conductive source/drain contact structure (CA) that is conductively coupled to a source/drain region of said transistor, wherein said conductive source/drain contact structure (CA) is axially offset from said conductive gate contact structure (CB) along a gate width direction of said transistor device.

10. The method of claim 1, wherein said transistor further comprises a conductive source/drain metallization structure conductively coupled to a source/drain region of said transistor and a layer of insulating material formed in a recess above said conductive source/drain metallization structure, wherein removing said at least a portion of said at least said initial sidewall spacer comprises performing at least one etching process to remove said at least said portion of said at least said initial sidewall spacer in the presence of said layer of insulating material formed in said recess, said layer of insulating material covering an upper surface of said conductive source/drain metallization structure during said at least one etching process.

11. A method of forming a conductive gate contact structure (CB) for a transistor formed above an active region defined in a semiconducting substrate, said transistor comprising a gate structure with an upper surface and sidewalls, an initial gate cap structure and an initial sidewall spacer positioned adjacent said sidewalls of said gate structure, the method comprising:

performing at least one etching process to remove said initial gate cap structure and to remove a vertical portion of said initial sidewall spacer so as to result in a recessed sidewall spacer and to thereby define a gate cavity that exposes an upper surface and at least a vertical portion of at least one of said sidewalls of said gate structure;

forming a replacement spacer structure above said recessed sidewall spacer and adjacent said exposed sidewalls of said gate structure, wherein said replacement spacer structure exposes a portion of said upper surface of said gate structure and wherein at least one air space is formed in said replacement spacer structure above said recessed sidewall spacer and adjacent at least a portion of at least one of said sidewalls of said gate structure;

forming a replacement gate cap structure in said gate cavity above said replacement spacer structure and on said exposed portion of said upper surface of said gate structure, said replacement gate cap structure comprising a gate cap material positioned above a conformal etch stop layer;

forming a layer of insulating material above said replacement gate cap structure, said layer of insulating material having a gate contact opening defined therein that exposes at least a portion of said replacement gate cap structure positioned above said active region, said gate contact opening being located entirely above said active region;

performing a first selective etching process through said gate contact opening to selectively remove a portion of said gate cap material selectively relative to said conformal etch stop layer so as to thereby expose at least a portion of said conformal etch stop layer;

performing a second selective etching process through said gate contact opening to selectively remove said exposed portion of said conformal etch stop layer relative to at least said gate structure so as to thereby expose at least a portion of said upper surface of said gate structure and thereby define a conductive gate contact opening; and forming a conductive gate contact structure (CB) in said conductive gate contact opening, wherein an entirety of said conductive gate contact structure (CB) is positioned vertically above said active region.

12. The method of claim 11, wherein said gate contact opening in said layer of insulating material also exposes a portion of said conformal etch stop layer.

13. The method of claim 11, wherein forming said replacement spacer structure comprises:

depositing material for said replacement spacer structure in said gate cavity and on said recessed sidewall spacer so as to thereby define said at least one air space, wherein said material for said replacement spacer structure covers an entirety of said upper surface of said gate structure; and performing an anisotropic etching process on said material for said replacement spacer structure so as to remove a portion of said deposited material for said replacement spacer structure from above at least a portion of said upper surface of said gate structure.

14. The method of claim 11, wherein forming said replacement gate cap structure in said gate cavity comprises performing a conformal deposition process to form said conformal etch stop layer.

15. The method of claim 11, further comprising forming a conductive source/drain contact structure (CA) that is conductively coupled to a source/drain region of said transistor, wherein said conductive source/drain contact structure (CA) is axially offset from said conductive gate contact structure (CB) along a gate width direction of said transistor device.

16. The method of claim 11, wherein said transistor further comprises a conductive source/drain metallization structure conductively coupled to a source/drain region of said transistor and a layer of insulating material formed in a recess above said conductive source/drain metallization structure, wherein said at least one etching process to remove said initial gate cap structure and to remove a vertical portion of said initial sidewall spacer is performed in the presence of said layer of insulating material formed in said recess, said layer of insulating material covering an upper surface of said conductive source/drain metallization structure during said at least one etching process.

17. A transistor device, comprising:

a gate structure positioned above an active region defined in a semiconducting substrate, said gate structure comprising an upper surface and sidewalls;

a spacer structure positioned adjacent said sidewalls of said gate structure, said spacer structure having at least one air space defined therein that is located adjacent at least a portion of at least one of said sidewalls of said gate structure, wherein said spacer structure exposes a portion of said upper surface of said gate structure;

a conformal etch stop layer positioned on and in contact with said spacer structure and on and in contact with said exposed portion of said upper surface of said gate structure;

a gate cap structure positioned on and in contact with said conformal etch stop layer;

a conductive gate contact opening that extends through at least said gate cap structure and said conformal etch stop layer, said conductive gate contact opening exposing at least a portion of said upper surface of said gate structure, wherein said conductive gate contact opening is located entirely above said active region; and a conductive gate contact structure (CB) positioned in said conductive gate contact opening, wherein an entirety of said conductive gate contact structure (CB) is positioned vertically above said active region.

18. The device of claim 17, wherein said spacer structure extends around an entire perimeter of said gate structure and is partially positioned above an isolation material that surrounds said active region.

19. The device of claim 17, wherein said at least one air space in said spacer structure is a continuous air space that extends around an entire perimeter of said gate structure and is partially positioned above an isolation material that surrounds said active region.

20. The device of claim 17, further comprising a conductive source/drain contact structure (CA) conductively coupled to a source/drain region of said transistor device, wherein said conductive source/drain contact structure (CA) is axially offset from said conductive gate contact structure (CB) along a gate width direction of said transistor device.

* * * * *